United States Patent
Wang et al.

(10) Patent No.: US 12,368,428 B2
(45) Date of Patent: Jul. 22, 2025

(54) 3D FILTER CIRCUIT AND 3D FILTER

(71) Applicant: ANHUI ANUKI TECHNOLOGIES CO., LTD., Anhui (CN)

(72) Inventors: Xiaodong Wang, Anhui (CN); Chenggong He, Anhui (CN); Chengjie Zuo, Anhui (CN); Jun He, Anhui (CN)

(73) Assignee: ANHUI ANUKI TECHNOLOGIES CO., LTD., Anhui (CN)

( * ) Notice: Subject to any disclaimer, the term of this patent is extended or adjusted under 35 U.S.C. 154(b) by 278 days.

(21) Appl. No.: 18/044,982

(22) PCT Filed: May 18, 2022

(86) PCT No.: PCT/CN2022/093484
§ 371 (c)(1),
(2) Date: Mar. 10, 2023

(87) PCT Pub. No.: WO2022/267756
PCT Pub. Date: Dec. 29, 2022

(65) Prior Publication Data
US 2023/0370039 A1   Nov. 16, 2023

(30) Foreign Application Priority Data
Jun. 21, 2021   (CN) .......................... 202110685700.9

(51) Int. Cl.
*H03H 7/01*   (2006.01)
*H03H 1/00*   (2006.01)

(52) U.S. Cl.
CPC ........ *H03H 7/0115* (2013.01); *H03H 7/0153* (2013.01); *H03H 2001/0085* (2013.01)

(58) Field of Classification Search
CPC ................... H03H 2001/0085; H03H 7/0115
USPC .................................................. 333/175, 185
See application file for complete search history.

(56) References Cited

U.S. PATENT DOCUMENTS

| | | | |
|---|---|---|---|
| 2006/0180342 A1 | 7/2006 | Takaya et al. | |
| 2007/0241839 A1* | 10/2007 | Taniguchi | H03H 7/1725 333/204 |
| 2009/0155624 A1 | 6/2009 | Dudesek et al. | |
| 2010/0283557 A1* | 11/2010 | Taniguchi | H03H 7/0115 333/204 |
| 2017/0310296 A1* | 10/2017 | Hahn | H01G 4/232 |
| 2020/0204141 A1 | 6/2020 | Choi et al. | |

(Continued)

FOREIGN PATENT DOCUMENTS

| | | |
|---|---|---|
| CN | 108766960 | 11/2018 |
| CN | 111564426 | 8/2020 |
| CN | 111181520 | 9/2020 |

(Continued)

OTHER PUBLICATIONS

International Search Report, PCT/CN2022/093484, mailed on Jul. 27, 2022.

*Primary Examiner* — Rakesh B Patel
(74) *Attorney, Agent, or Firm* — Greenberg Traurig

(57) ABSTRACT

Provided are a 3D filter circuit and a 3D filter. The 3D filter circuit includes a multilayer structure. The multilayer structure includes at least two conductive layers and at least one organic dielectric layer. Each organic dielectric layer is disposed between different conductive layers. The multilayer structure is configured to form at least one capacitor.

8 Claims, 2 Drawing Sheets

(56) References Cited

U.S. PATENT DOCUMENTS

2022/0173055 A1* 6/2022 Ting ..................... H01G 4/012

FOREIGN PATENT DOCUMENTS

| | | |
|---|---|---|
| CN | 212113714 | 12/2020 |
| CN | 112671366 | 4/2021 |
| CN | 113381715 | 9/2021 |
| JP | 2002198629 | 7/2002 |
| JP | 2002280261 | 9/2002 |
| JP | 2004311987 | 11/2004 |
| JP | 2004319561 | 11/2004 |
| JP | 2005109951 | 4/2005 |
| JP | 2005347782 | 12/2005 |
| KR | 20090015130 | 2/2009 |
| WO | 2004089049 | 10/2004 |
| WO | 2014045775 | 3/2014 |
| WO | 2016088540 | 6/2016 |

* cited by examiner

3D FILTER CIRCUIT AND 3D FILTER

This application is a national phase application under 37 U.S.C. 371 of International Patent Application PCT/CN2022/093484, filed on May 18, 2022, which claims priority to Chinese Patent Application No. 202110685700.9 filed with the China National Intellectual Property Administration (CNIPA) on Jun. 21, 2021, the disclosure of which is incorporated herein by reference in its entirety.

TECHNICAL FIELD

The present disclosure relates to the technical field of signal processing, and, for example, to a three-dimensional (3D) filter circuit and a 3D filter.

BACKGROUND

As essential elements in radio-frequency front ends of wireless communication, filters are widely used in wireless communication. With the rapid development of wireless communication fields such as 5G and Internet of Things, the demand for filters in radio-frequency front ends has greatly increased, resulting in an increasingly high requirement for miniaturization and high performance of the filters.

SUMMARY

The present disclosure provides a 3D filter circuit and a 3D filter so as to achieve the design requirement for miniaturization and high performance of the filter circuit.

In a first aspect, the present disclosure provides a 3D filter circuit. The 3D filter circuit includes a multilayer structure.

The multilayer structure includes at least two conductive layers and at least one organic dielectric layer. Each organic dielectric layer is disposed between different conductive layers. The multilayer structure is configured to form at least one capacitor.

In a second aspect, the present disclosure further provides a 3D filter. The 3D filter includes the 3D filter circuit provided in any embodiment in the first aspect.

BRIEF DESCRIPTION OF DRAWINGS

Drawings used in the description of the embodiments or the related art are described hereinafter. The drawings described hereinafter illustrate only part of embodiments of the present disclosure.

REFERENCE LIST

Figure 1:
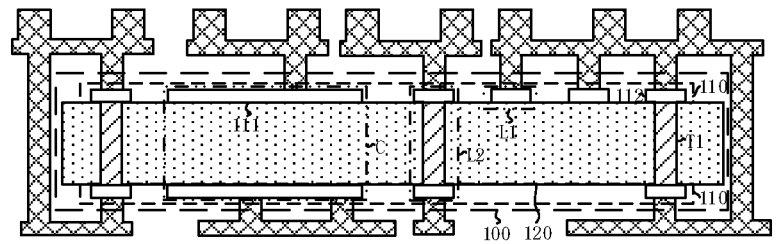
FIG. 1 is a diagram illustrating the structure of a 3D filter circuit according to an embodiment of the present disclosure.

100 multilayer structure
110 conductive layer
111 first pattern structure
112 second pattern structure
113 third pattern structure
120 organic dielectric layer
200 encapsulation layer
210 insulating dielectric layer
220 conductive structure

DETAILED DESCRIPTION

Embodiments of the present disclosure will be described in conjunction with drawings in embodiments of the present disclosure. The embodiments described herein are part, not all, of embodiments of the present disclosure.

Embodiments of the present disclosure provide a 3D filter circuit. FIG. 1 is a diagram illustrating the structure of a 3D filter circuit according to an embodiment of the present disclosure. As shown in FIG. 1, the 3D filter circuit includes a multilayer structure 100. The multilayer structure 100 includes at least two conductive layers 110 and at least one organic dielectric layer 120. Each organic dielectric layer 120 is disposed between different conductive layers 110. The multilayer structure 100 is configured to form at least one capacitor C.

In this embodiment, the multilayer structure 100 is a three-dimensional structure composed of the at least two conductive layers 110 and the at least one organic dielectric layer 120. The organic dielectric layer 120 in the multilayer structure 100 may serve as a dielectric between substrates of the capacitor C. Exemplarily, the at least one organic dielectric layer 120 included in the multilayer structure 100 is disposed between the at least two conductive layers 110. The at least one capacitor C may be formed at a position where a vertical projection of the at least two conductive layers 110 overlaps a vertical projection of the at least one organic dielectric layer 120. A conductive layer 110 at the position where the vertical projection of the at least two conductive layers 110 overlaps the vertical projection of the at least one organic dielectric layer 120 serves as an electrode plate of the at least one capacitor C. An organic dielectric layer 120 at the position where the vertical projection of the at least two conductive layers 110 overlaps the vertical projection of the at least one organic dielectric layer 120 serves as a dielectric of the capacitor C. A material of the at least one organic dielectric layer 120 used in the multilayer structure 100 is various in type, highly selective and low in cost. Additionally, the at least one organic dielectric layer 120 has a diversified composition structure and a wide space-adjusting performance and can adjust the performance of the at least one capacitor C well to enable the at least one capacitor C to meet the requirement for high performance. Thus, the 3D filter circuit is composed of at least one multilayer structure 100, and the integration level of the at least one capacitor C can be improved, so that the design requirement for miniaturization and high performance of the filter circuit is achieved.

Figure 2:
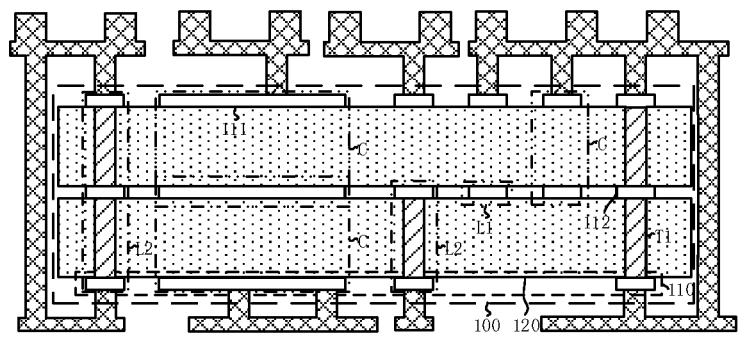
FIG. 2 is a diagram illustrating the structure of another 3D filter circuit according to an embodiment of the present disclosure.

Exemplarily, FIG. 2 is a diagram illustrating the structure of another 3D filter circuit according to an embodiment of the present disclosure. As shown in FIG. 2, the multilayer structure 100 is a three-dimensional structure composed of three conductive layers 110 and two organic dielectric layers 120, and one organic dielectric layer 120 is disposed between each two conductive layers 110. Three capacitors C may be formed in the multilayer structure 100 in this solution.

It is to be noted that FIG. 1 exemplarily illustrates the case where the multilayer structure 100 includes two conductive layers 110 and one organic dielectric layer 120 and one capacitor C is formed. FIG. 2 exemplarily illustrates the case where the multilayer structure 100 includes three conductive layers 110 and two organic dielectric layers 120 and three capacitors C are formed. In other embodiments, the number of conductive layers 110 and the number of organic dielectric layers between the conductive layers 110 may be set according to actual requirements. The number of capacitors C formed in the multilayer structure 100 may be set according to actual requirements.

Optionally, with continued reference to FIG. 1 or 2, the at least two conductive layers 110 include a plurality of first pattern structures 111. Vertical projections of first pattern structures 111 in different conductive layers 110 on an organic dielectric layer 120 overlap each other. A plurality of capacitors C are formed at positions where vertical projections of the first pattern structures 111 in the different conductive layers 110 on the organic dielectric layer 120 overlap each other.

In an embodiment, when a plurality of device structures are formed in the multilayer structure 100, different device structures may be formed through different pattern structures in the conductive layers 110, avoiding a short circuit between the different device structures. Exemplarily, one conductive layer 110 in FIG. 1 includes one first pattern structure 111, where the first pattern structure 111 is a conductive layer 110 at a position where a vertical projection of the at least two conductive layers 110 overlaps a vertical projection of the at least one organic dielectric layer 120. If the at least two conductive layers 110 include a plurality of first pattern structures 111, a plurality of capacitors C may be formed on positions where vertical projections of multiple first pattern structures 111 in different conductive layers 110 on the organic dielectric layer 120 overlap each other. Accordingly, the multilayer structure 100 may be densely provided with the plurality of capacitors C, not only meeting the requirement of the 3D filter circuit for the capacitors C to ensure the design requirement for the high-performance of the 3D filter circuit, but also achieving the miniaturization of the 3D filter circuit.

Optionally, with continued reference to FIG. 1 or 2, the at least two conductive layers 110 are further configured to form at least one of a planar inductor L1 or a 3D inductor L2.

In this embodiment, an inductor may be formed in the conductive layers 110 in the multilayer structure 100. Optionally, the inductor includes a planar inductor L1 and a 3D inductor L2. The planar inductor L1 is formed by a single conductive layer 110. The 3D inductor L2 is formed by electrically connecting the at least two conductive layers 110. Thus, the at least two conductive layers 110 in the multilayer structure 100 may be densely provided with at least one of the planar inductor L1 or the 3D inductor L2, not only meeting the requirement of the 3D filter circuit for an inductor to ensure the design requirement for the high performance of the 3D filter circuit, but also achieving the miniaturization of the 3D filter circuit.

Optionally, with continued reference to FIG. 1 or 2, the multilayer structure 100 includes the 3D inductor L2. A first through hole T1 is disposed on the at least one organic dielectric layer 120. The first through hole T1 is filled with a conductive material. Each conductive layer 110 includes at least one second pattern structure 112. Second pattern structures 112 in different conductive layers 110 are connected through the first through hole T1 and are configured to form at least one 3D inductor L2.

In this embodiment, the multilayer structure 100 includes the at least two conductive layers 110 and the at least one organic dielectric layer 120. The at least organic dielectric layer 120 is disposed between the at least two conductive layers 110. The multilayer structure 100 includes the 3D inductor L2, which requires the at least two conductive layers 110 included in the multilayer structure 100 be electrically connected to each other. Optionally, the first through hole T1 may be disposed on the at least one organic dielectric layer 120 and filled with the conductive material, so that conductive layers 110 in different layers are electrically connected to each other through the first through hole T1, thereby forming the 3D inductor L2. To avoid a short circuit between different device structures, the different device structures are formed through different pattern structures in the conductive layers 110. For example, parts of conductive layers 110 in different layers that are electrically connected through the first through hole T1 are taken as second pattern structures 112. Each conductive layer 110 in the multilayer structure 110 includes at least one second pattern structure 112. If second pattern structures 112 in different conductive layers 110 are connected through the first through hole T1, at least one 3D inductor L2 may be formed. Thus, the at least two conductive layers 110 in the multilayer structure 100 may be densely provided with at least one 3D inductor L2, improving the arrangement compactness of inductor and achieving the miniaturization of the 3D filter circuit.

Optionally, the material of the at least one organic dielectric layer includes at least one of epoxy resin, polypheylene ether (PPE) resin, or polyimide (PI).

In this embodiment, the material, for example, epoxy resin, PPE resin, or PI resin, used in the at least one organic dielectric layer provides good insulation. Epoxy resin has, for example, excellent insulating properties, excellent mechanical properties, excellent chemical stability. With dielectric properties ranking the first among engineering plastics, PPE resin has, for example, good mechanical properties, thermal properties, water-resisting properties and flame-retardant properties. PI resin features stable insulation, corrosion resistance, high-temperature resistance, wear resistance, impact resistance, and long service life. Thus, the at least one organic dielectric layer is made of epoxy resin, PPE resin, PI resin, or the like, which can well serve as a dielectric material for a capacitor, thereby ensuring the insulation between two electrode plates of the capacitor.

Optionally, a material of the at least two conductive layers includes copper foil or electroplated copper.

In this embodiment, the copper foil or electroplated copper may be attached to various base materials, for example, metal or an insulating material, and has a relatively wide temperature range. The conductive copper foil is disposed on a base surface, and combined with a metal base material, the conductive copper foil has excellent conductivity and provides an electromagnetic shielding effect. Copper ions in an electrolyte are plated on a base surface to acquire a relatively thin, fine and smooth copper layer with good electrical conductivity. The use of copper foil or electroplated copper as the material of the conductive layer not only ensures the thinness of the conductive layer to reduce the volume of the conductive layer, but also ensures good conductivity of the conductive layer.

Figure 3:
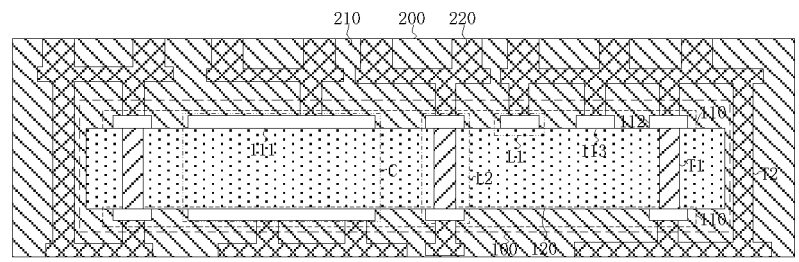
FIG. 3 is a diagram illustrating the structure of another 3D filter circuit according to an embodiment of the present disclosure.

FIG. 3 is a diagram illustrating the structure of another 3D filter circuit according to an embodiment of the present disclosure. As shown in FIG. 3, the 3D filter circuit further includes an encapsulation layer 200. The encapsulation layer 200 is configured to encapsulate the multilayer structure 100.

In this embodiment, the encapsulation layer 200 is wrapped outside the multilayer structure 100 so that the multilayer structure 100 is encapsulated in the encapsulation layer 200, protecting the multilayer structure 100 from being affected by various unfavorable factors in the external environment, and prolonging the service life of the multilayer structure 100.

Optionally, with continued reference to FIG. 3, the encapsulation layer 200 includes an insulating dielectric layer 210 and a conductive structure 220. The insulating dielectric layer 210 wraps the multilayer structure 100. A second through hole T2 is disposed on the insulating dielectric layer 210. The second through hole T2 is filled with a conductive material configured to form the conductive structure 220. The at least two conductive layers 110 are connected to an external circuit through the second through hole T2.

In this embodiment, the encapsulation layer 200 is composed of the insulating dielectric layer 210 and the conductive structure 220. Optionally, the insulating medium is wrapped outside the multilayer structure 100, and the multilayer structure 100 needs to be electrically connected to the external circuit. Accordingly, the second through hole T2 filled with the conductive material needs to be disposed on the insulating dielectric layer 210 to form the conductive structure 220 configured to conduct the multilayer structure 100 to the external circuit. The at least two conductive layers 110 of the multilayer structure 100 may be connected to a circuit of an external device through the second through hole T2 to achieve the transmission of an electric signal.

Optionally, with continued reference to FIG. 3, the at least two conductive layers 110 further include at least one third pattern structure 113. The at least one third pattern structure 113 is connected to the conductive structure 220.

In this embodiment, to avoid a short circuit between different device structures, different device structures are formed through different pattern structures in the conductive layers 110. For example, the third pattern structure 113 may serve as a part of a conductive layer 110 forming the planar inductor L1 or a part of a conductive layer 110 for connecting a capacitor C to an inductor in the multilayer structure 100. The at least two conductive layers 110 include at least one third pattern structure 113, namely, the at least two conductive layers 110 may form at least one planar inductor L1 or one conductive part for connecting a capacitor C to an inductor in the multilayer structure 100. The at least one third pattern structure 113 is connected to the conductive structure 220 so that different third pattern structures 113 of the multilayer structure 100 can be connected to each other through the conductive structure 220. Alternatively, the at least one third pattern structure 113 is connected to the conductive structure 220, which enables the at least one planar inductor L1 formed by the at least one third pattern structure 113 to be connected to the conductive structure 220, so that the at least one planar inductor L1 is connected to the external circuit, achieving the transmission of an electric signal.

It is to be noted that FIGS. 1, 2, and 3 merely exemplarily illustrate structural diagrams in each of which the 3D filter circuit includes one multilayer structure 100. In other embodiments, the number of multilayer structures 100 in the 3D filter circuit may be set according to actual requirements.

Figure 4:
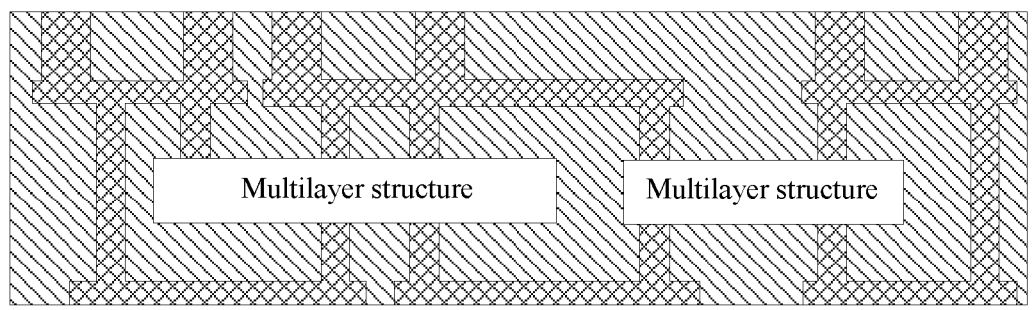
FIG. 4 is a diagram illustrating the structure of another 3D filter circuit according to an embodiment of the present disclosure.
Figure 5:
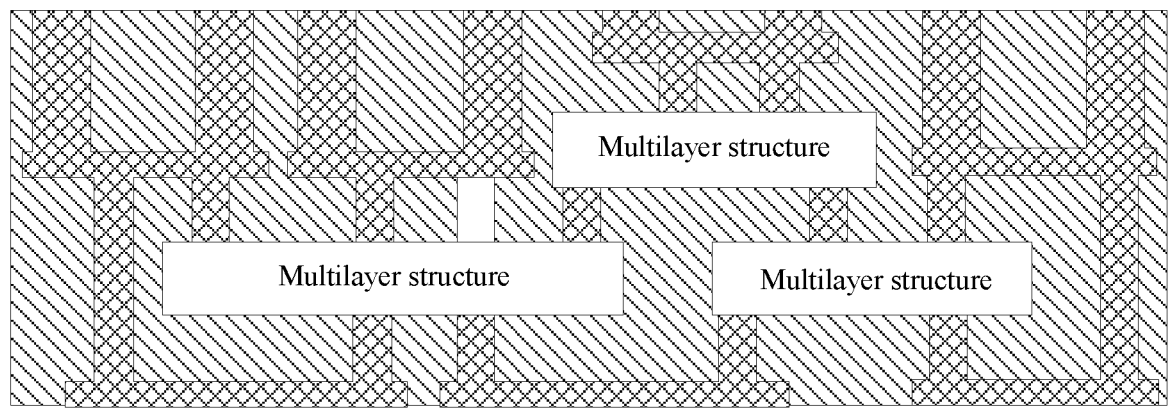
FIG. 5 is a diagram illustrating the structure of another 3D filter circuit according to an embodiment of the present disclosure.

FIG. 4 is a diagram illustrating the structure of another 3D filter circuit according to an embodiment of the present disclosure. FIG. 5 is a diagram illustrating the structure of another 3D filter circuit according to an embodiment of the present disclosure.

FIG. 4 a diagram exemplarily illustrating the structure of the 3D filter circuit including two multiplayer structures. FIG. 5 is a diagram exemplarily illustrating the structure of the 3D filter circuit including three multiplayer structures.

Embodiments of the present disclosure further provide a 3D filter. The 3D filter includes any 3D filter circuit in the preceding embodiments.

The 3D filter includes the 3D filter circuit provided in any embodiment of the present disclosure and therefore has the effect of the 3D filter circuit provided in embodiments of the present disclosure, which is not repeated here.

What is claimed is:

1. A three-dimensional (3D) filter circuit, comprising:
   a multilayer structure, wherein the multilayer structure comprises:
      an encapsulation layer;
      at least two conductive layers; and
      at least one organic dielectric layer;
   wherein each of the at least one organic dielectric layer is disposed between different conductive layers of the at least two conductive layers; and
   wherein the multilayer structure is configured to form a plurality of capacitors, at least one planar inductor and at least one 3D inductor;
   wherein the at least two conductive layers comprise a plurality of first pattern structures;
      vertical projections of the first pattern structures in different conductive layers on the at least one organic dielectric layer overlap each other; and the plurality of capacitors are formed on positions where the vertical projections of the first pattern structures in the different conductive layers on the at least one organic dielectric layer overlap each other;
   wherein the at least two conductive layers are further configured to form the at least one planar inductor and the at least one 3D inductor;
   wherein a first through hole filled with a conductive material is disposed on the at least one organic dielectric layer; each of the at least two conductive layers comprises second pattern structures configured in different conductive layers, connected through the first through hole, and configured to form the at least one 3D inductor; and a conductive layer of the at least two conductive layers is configured to form the at least one planar inductor;
   wherein the encapsulation layer is configured to encapsulate the multilayer structure; and
   the encapsulation layer comprises an insulating dielectric layer and a conductive structure; and
   wherein the insulating dielectric layer wraps the multilayer structure; a second through hole is disposed on the insulating dielectric layer; the second through hole is filled with a conductive material configured to form the conductive structure; and the at least two conductive layers are connected to an external circuit through the second through hole.

2. The 3D filter circuit according to claim 1, wherein a material of the at least one organic dielectric layer comprises at least one of epoxy resin, polypheylene ether (PPE) resin, or polyimide (PI) resin.

3. The 3D filter circuit according to claim 1, wherein a material of the at least two conductive layers comprises copper foil or electroplated copper.

4. The 3D filter circuit according to claim 1, wherein the at least two conductive layers further comprise at least one third pattern structure, and the at least one third pattern structure is connected to the conductive structure.

5. A three-dimensional (3D) filter, comprising the 3D filter circuit according to claim 1.

6. The 3D filter according to claim 5, wherein a material of the at least one organic dielectric layer comprises at least one of epoxy resin, polypheylene ether (PPE) resin, or polyimide (PI) resin.

7. The 3D filter according to claim 5, wherein a material of the at least two conductive layers comprises copper foil or electroplated copper.

8. The 3D filter according to claim 5, wherein the at least two conductive layers further comprise at least one third pattern structure, and the at least one third pattern structure is connected to the conductive structure.

* * * * *